United States Patent [19]
Nilssen

[11] Patent Number: 5,491,385
[45] Date of Patent: Feb. 13, 1996

[54] INSTANT-ON SCREW-IN FLUORESCENT LAMP

[76] Inventor: Ole K. Nilssen, Caesar Dr., Barrington, Ill. 60010

[21] Appl. No.: 47,944

[22] Filed: Apr. 16, 1993

Related U.S. Application Data

[63] Continuation-in-part of Ser. No. 955,229, Oct. 1, 1992, Pat. No. 5,233,270, which is a continuation of Ser. No. 607,271, Oct. 31, 1990, abandoned, which is a continuation-in-part of Ser. No. 787,692, Oct. 15, 1985, abandoned, which is a continuation of Ser. No. 644,155, Aug. 27, 1984, abandoned, which is a continuation of Ser. No. 555,426, Nov. 23, 1983, abandoned, which is a continuation of Ser. No. 178,107, Aug. 14, 1980, abandoned.

[51] Int. Cl.⁶ .......................... H05B 41/29; H05B 41/38; H05B 39/02; H05B 39/04
[52] U.S. Cl. .................. 315/178; 315/58; 315/209 R; 315/DIG. 5
[58] Field of Search ................. 315/209 R, 178, 315/179, 182, 58, 180, 181, 183, DIG. 5

[56] References Cited

U.S. PATENT DOCUMENTS

| | | | |
|---|---|---|---|
| 2,012,239 | 8/1935 | Eknayan | 315/178 |
| 4,268,780 | 5/1981 | Roche et al. | 315/179 |
| 4,297,616 | 10/1981 | Corona | 315/179 |
| 4,350,930 | 9/1982 | Peil et al. | 315/178 X |
| 4,494,041 | 1/1985 | Roche et al. | 315/179 X |

*Primary Examiner*—David Mis

[57] ABSTRACT

A compact folded fluorescent lamp and a small incandescent lamp are both mounted on an ordinary Edison-type screw-base capable of being screwed into an ordinary lamp socket at which ordinary AC power line voltage is controllably provided. An inverter-type ballast is integrally combined with the base and is operable to power the fluorescent lamp whenever the base is indeed screwed into the lamp socket. The incandescent lamp is powered from the AC power line voltage by way of an SCR whose conduction angle is controlled such as to cause the total light provided from the combination fluorescent-incandescent lamp to remain substantially constant from the very first moment that AC power line voltage is provided at the lamp socket. Thus, when the AC power line voltage is initially provided, the light provided from the incandescent lamp will be at its maximum while the light provided from the fluorescent lamp will be at its minimum. Thereafter, the light from the incandescent lamp will gradually diminish as the light from the fluorescent lamp gradually increases. After a brief period, the AC power line voltage will be totally disconnected from the incandescent lamp.

43 Claims, 4 Drawing Sheets

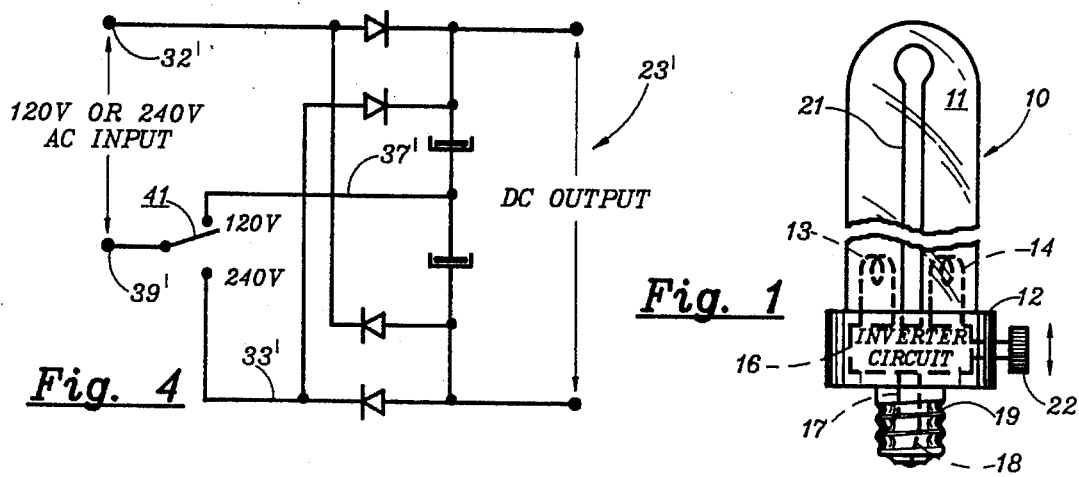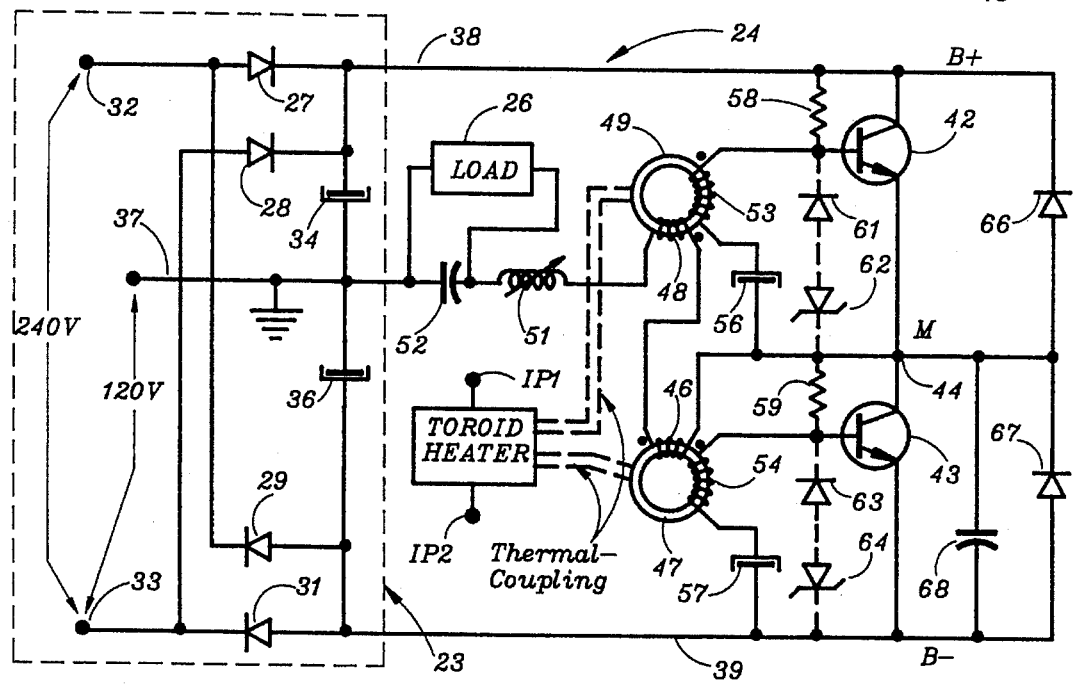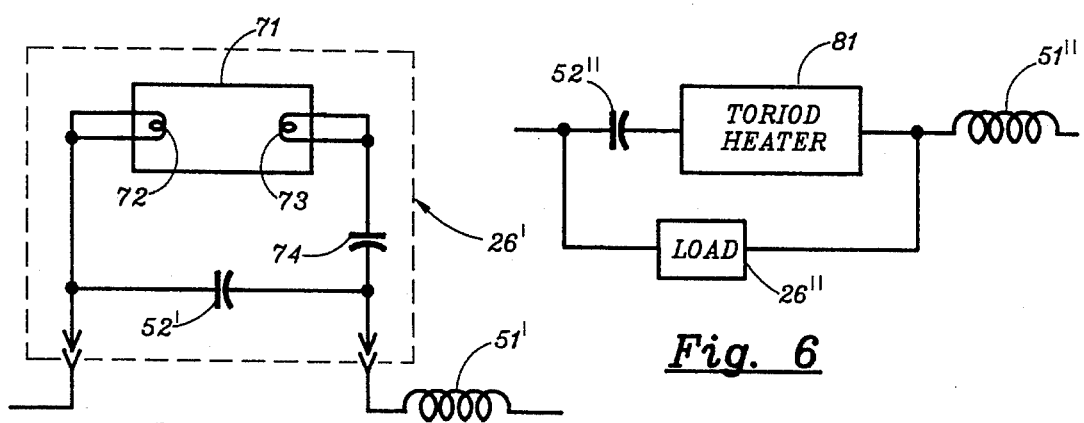

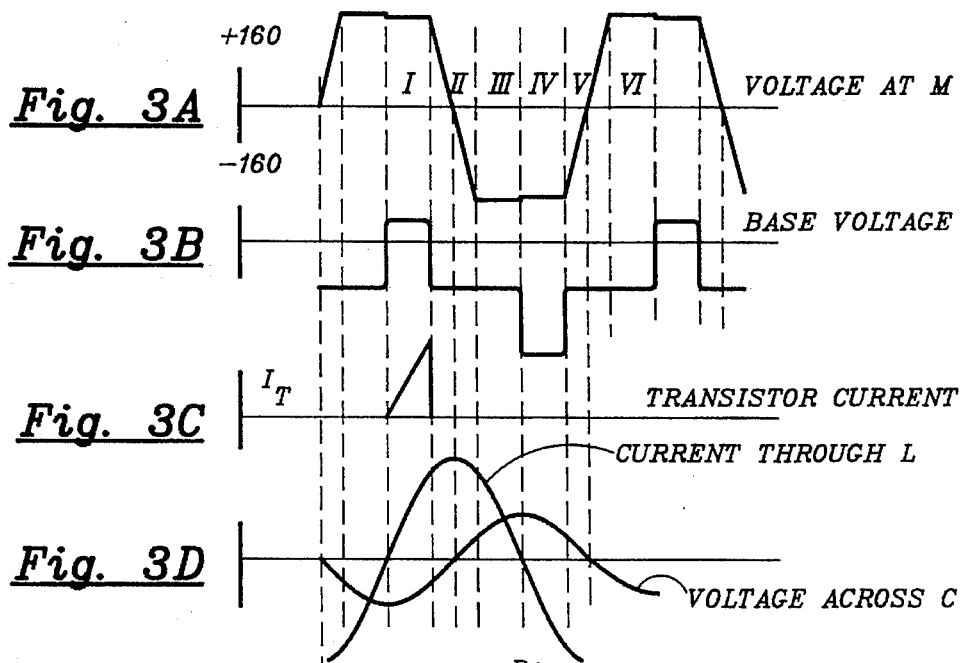
Fig. 3A VOLTAGE AT M
Fig. 3B BASE VOLTAGE
Fig. 3C TRANSISTOR CURRENT
Fig. 3D CURRENT THROUGH L / VOLTAGE ACROSS C
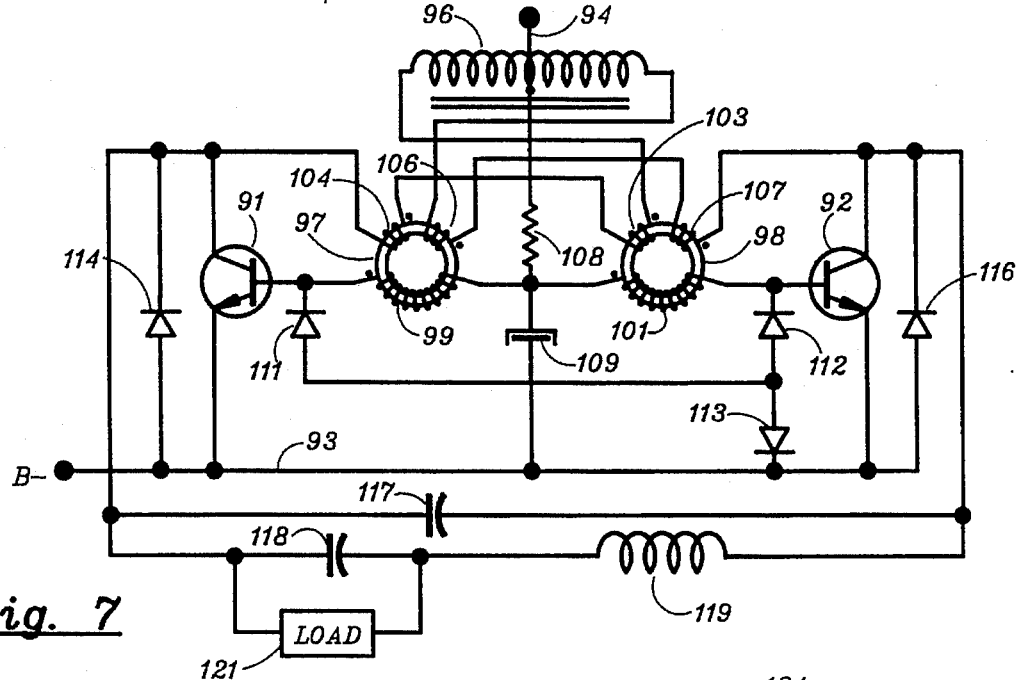
Fig. 7
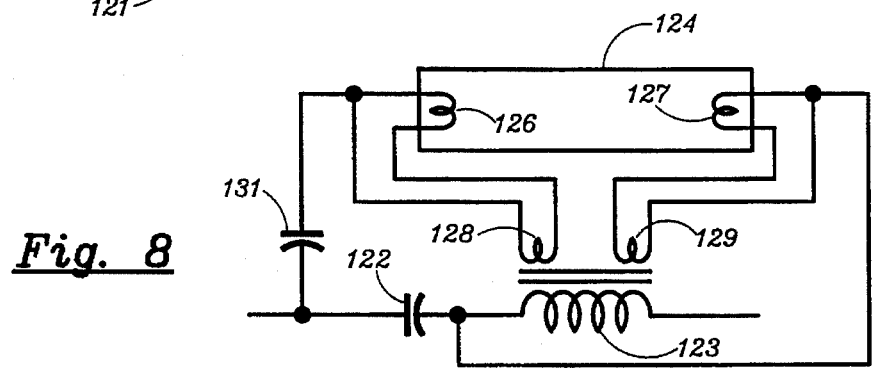
Fig. 8

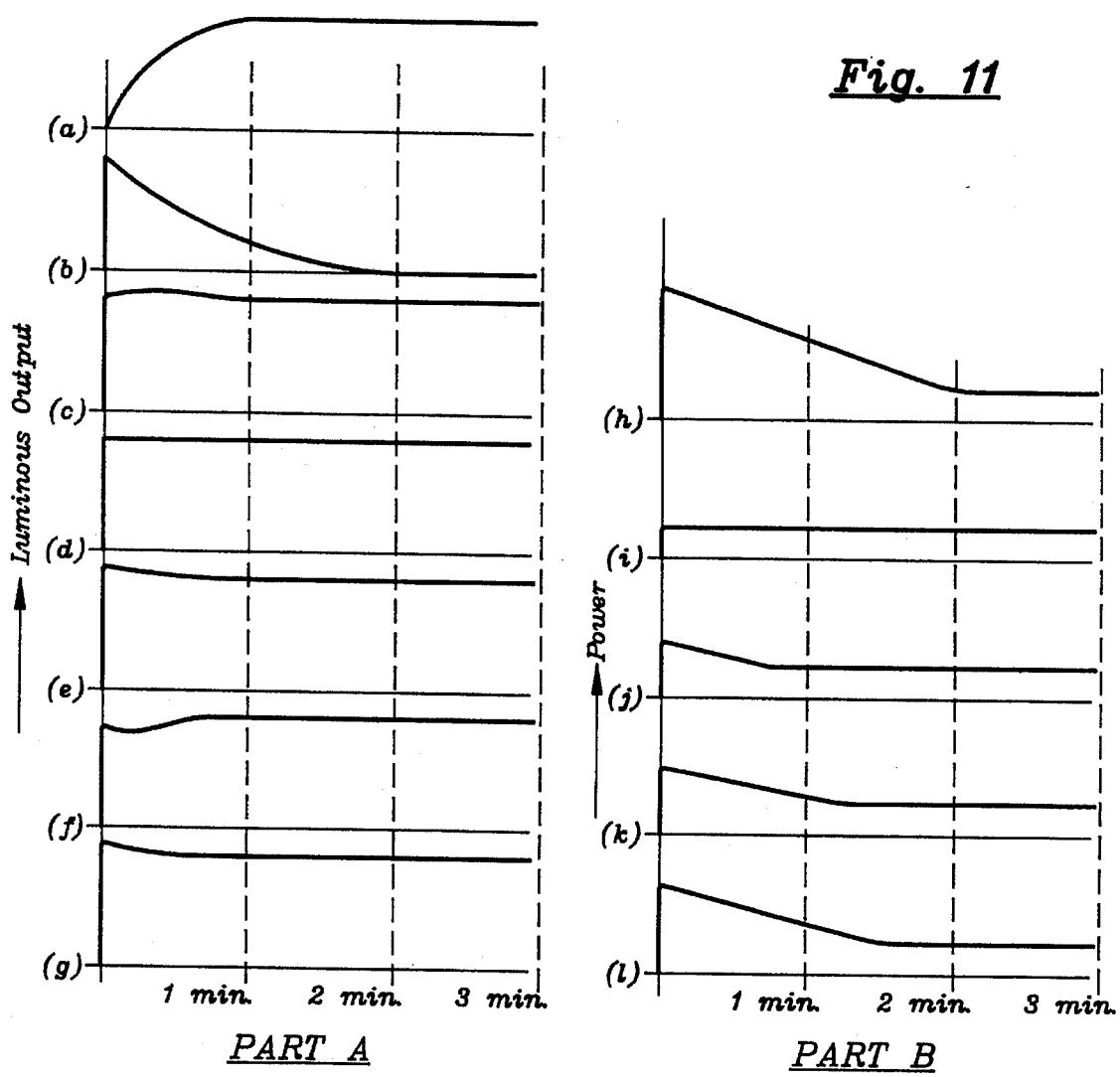
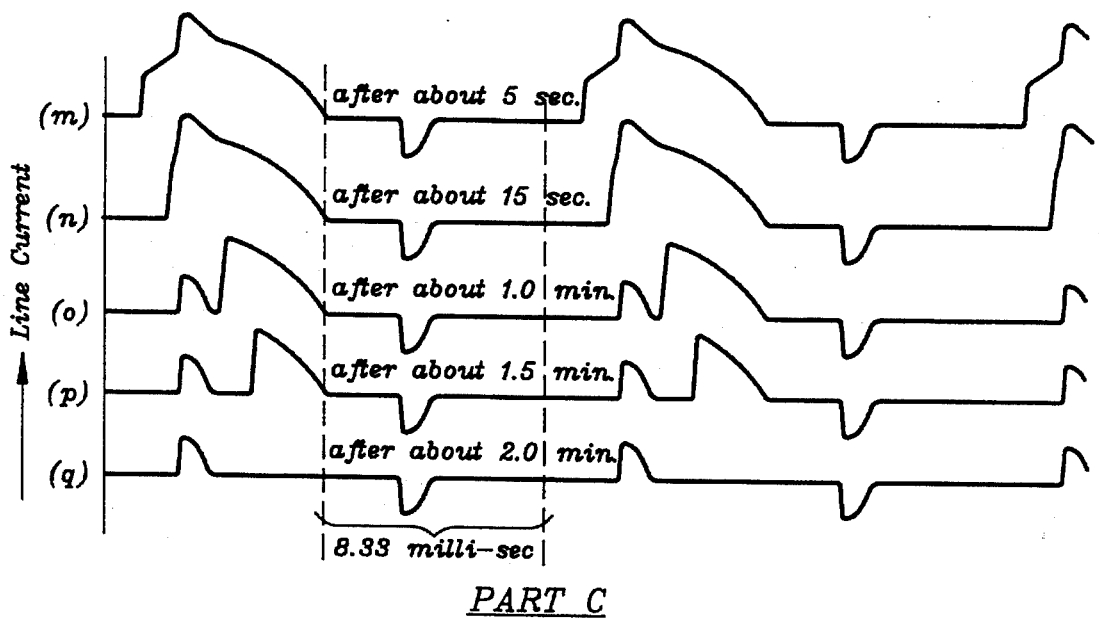
Fig. 11

INSTANT-ON SCREW-IN FLUORESCENT LAMP

RELATED APPLICATIONS

The present application is a Continuation-in-Part of Ser. No. 07/955,229 filed Oct. 1, 1992, now U.S. Pat. No. 5,233,270; which is a Continuation of Ser. No. 07/607,271 filed Oct. 31, 1990, now abandoned; which is a Continuation-in-Part of Ser. No. 06/787,692 filed Oct. 15, 1985, now abandoned; which is a Continuation of Ser. No. 06/644,155 filed Aug. 27, 1984, now abandoned; which is a Continuation of Ser. No. 06/555,426 filed Nov. 23, 1983, now abandoned; which is a Continuation of Ser. No. 06/178,107 filed Aug. 14, 1980, now abandoned.

BACKGROUND OF THE INVENTION

1. Field of Invention

This invention relates to screw-in fluorescent lamps as well as to power supplies particularly useful for ballasting gas discharge lamps.

2. Description of Prior Art

For a description of pertinent prior art, reference is made to U.S. Pat. No. 4,677,345 to Nilssen; which patent issued from a Division of application Ser. No. 06/178,107 filed Aug. 14, 1980; which application is the original progenitor of instant application.

Otherwise, reference is made to the following U.S. Pat. Nos. 3,263,122 to Genuit; No. 3,320,510 to Locklair; No. 3,996,493 to Davenport et el.; No. 4,100,476 to Ghiringhelli; No. 4,262,327 to Kovacik et al.; No. 4,370,600 to Zansky; and Nos. 4,634,932, 4,857,806, 5,047,690, 5,164,637, 5,166,578, 5,185,560, 5,191,262 to Nilssen.

SUMMARY OF THE INVENTION

Objects of the Invention

An object of the present invention is that of providing an instant-on screw-in fluorescent lamp.

This as well as other objects, features and advantages of the present invention will become apparent from the following description and claims.

BRIEF DESCRIPTION OF THE DISCLOSURE

The present invention is directed to providing improved gas discharge lighting means and inverter circuits for powering and controlling gas discharge lamps. The inverter circuits according to the present invention are highly efficient, can be compactly constructed and are ideally suited for energizing gas discharge lamps, particularly compact folded "instant-start" "self-ballasted" fluorescent lamps.

According to one feature of the present invention, a series-connected combination of an inductor and a capacitor is provided in circuit with the inverter transistors to be energized upon periodic transistor conduction. Transistor drive current is preferably provided through the use of at least one saturable inductor to control the transistor inversion frequency to be equal to or greater than the nature resonant frequency of the inductor and capacitor combination. The high voltages efficiently developed by loading the inverter with the inductor and capacitor are ideally suited for energizing external loads such as gas discharge lamps. In such an application, the use of an adjustable inductor permits control of the inverter output as a means of adjusting the level of lamp illumination.

According to another feature of the present invention, reliable and highly efficient half-bridge inverters include a saturable inductor in a current feedback circuit to drive the transistors for alternate conduction. The inverters also include a load having an inductance sufficient to effect periodic energy storage for self-sustained transistor inversion. Importantly, improved reliability is achieved because of the relatively low and transient-free voltages across the transistors in these half-bridge inverters.

Further, according to another feature of the present invention, novel and economical power supplies particularly useful with the disclosed inverter circuits convert conventional AC input voltages to DC for supplying to the inverters.

Yet further, according to still another feature of the invention, a rapid-start fluorescent lamp is powered by way of a series-resonant LC circuit; while heating power for the lamp's cathodes is provided via loosely-coupled auxiliary windings on the tank inductor of the LC circuit. Alternatively, cathode heating power is provided from tightly-coupled windings on the tank inductor; in which case output current-limiting is provided via a non-linear resistance means, such as an incandescent filament in a light bulb, connected in series with the output of each winding.

BRIEF DESCRIPTION OF THE PRESENTLY PREFERRED EMBODIMENT

A compact folded fluorescent lamp and a small cylindrical soft-glass incandescent lamp are both mounted on an ordinary Edison-type screw-base capable of being screwed into an ordinary lamp socket at which ordinary AC power line voltage is controllably provided. The incandescent lamp is small enough to be mounted within the fold of the fluorescent lamp.

An inverter-type electronic ballast is integrally combined with the base and is operable to power the fluorescent lamp whenever the base is indeed screwed into the lamp socket.

The incandescent lamp is powered from the AC power line voltage by way of an SCR whose conduction angle is controlled such as to cause the total light provided from the combination fluorescent-incandescent lamp to remain substantially constant from the very first moment that AC power line voltage is provided at the lamp socket.

Thus, each time AC power line voltage is initially provided, the light emitted from the incandescent lamp will be at its maximum while the light emitted from the fluorescent lamp will be at its minimum. Thereafter, as the fluorescent lamp warms up and the light emitted from it gradually increases, the light emitted from the incandescent lamp will correspondingly diminish, thereby to cause the combined light output to remain substantially constant.

After a brief period of not more than a few minutes, the AC power line voltage will be totally disconnected from the incandescent lamp.

With ordinary 120 Volt/60 Hz power line voltage provided at the lamp socket, the RMS magnitude of the voltage provided to the filament of the incandescent lamp is limited to a maximum RMS magnitude of about 84 Volt; which means that the incandescent lamp should be of a type designed for proper operation at 84 Volt RMS rather than at 120 Volt RMS.

In an ordinary usage situation, which is stipulated to be one wherein the combination fluorescent-incandescent lamp is powered for about one hour at a time, the incandescent lamp is powered for only a small fraction of the total time. Thus, the relatively low luminous efficacy of the incandescent lamp will not materially detract from the relatively high luminous efficacy of the fluorescent lamp.

Morever, due to its short ON-time and very low duty-cycle, the incandescent lamp, which has a soft glass envelope, is many times smaller than an ordinary soft-glass incandescent lamp of the same power rating.

BRIEF DESCRIPTION OF THE DRAWINGS

FIG. 1 is a front elevation of a folded fluorescent lamp unit adapted for screw-in insertion into a standard Edison incandescent socket;

FIG. 2 is a schematic diagram illustrating the essential features of a push-pull inverter circuit particularly suitable for energizing the lamp unit of FIG. 1;

FIG. 3A–3D is a set of waveform diagrams of certain significant voltages and currents occurring in the circuit of FIG. 2;

FIG. 4 is a schematic diagram of a DC power supply connectable to both 120 and 240 volt AC inputs;

FIG. 5 is a schematic diagram which illustrates the connection of a non-self-ballasted gas discharge lamp unit to the FIG. 2 inverter circuit;

FIG. 6 is a schematic diagram which illustrates the use of a toroid heater for regulation of the inverter output;

FIG. 7 is an alternate form of push-pull inverter circuit accordind to the present invention;

FIG. 8 is a schematic diagram showing the connection of a gas discharge lamp of the "rapid-start" type to an inductor-capacitor-loaded inverter according to the present invention;

FIG. 11 part A to FIG. 11 part C illustrate various characteristic voltage and current waveforms associated with the preferred embodiment of the invention.

DESCRIPTION OF INITIAL EMBODIMENTS OF THE INVENTION

Figure 9:
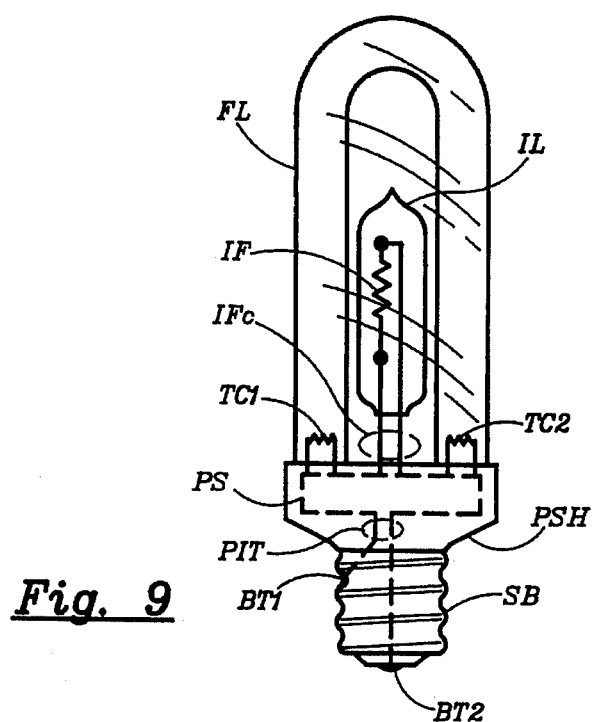
FIG. 9 illustrates the presently preferred embodiment of the invention.

FIG. 1 illustrates a screw-in gas discharge lamp unit 10 comprising a folded fluorescent lamp 11 suitably secured to an integral base 12. The lamp comprises two cathodes 13, 14 which are supplied with the requisite high operating voltage from a frequency-converting power supply and ballasting circuit 16; which, because of its compact size, conveniently fits within the base 12.

The inverter circuit 16 is connected by leads 17, 18 to a screw-type plug 19 adapted for screw-in insertion into a standard Edison-type incandescent lamp socket at which ordinary 120 Volt/60 Hz power line voltage is available. A ground plane comprising a wire or metallic strip 21 is disposed adjacent a portion of the fluorescent lamp 11 as a starting aid. Finally, a manually rotatable external knob 22 is connected to a shaft for mechanical adjustment of the air gap of a ferrite core inductor to vary the inductance value thereof in order to effect adjustment of the inverter voltage output connected to electrodes 13, 14 for controlled variation of the lamp illumination intensity.

With reference to FIG. 2, a power supply 23, connected to a conventional AC input, provides a DC output for supplying a high-efficiency inverter circuit 24. The inverter is operable to provide a high voltage to an external load 26, which may comprise a gas discharge device sich as the fluorescent lamp 11 of FIG. 1.

The power supply 23 comprises bridge rectifier having four diodes 27, 28, 29 and 31 connectable to a 240 volt AC supply at terminals 32, 33. Capacitors 34, 36 are connected between a ground line 37 (in turn directly connected to the inverter 24) and to a B+ line 38 and a B– line 39, respectively. The power supply 23 also comprises a voltage doubler and rectifier optionally connectable to a 120 volt AC input taken between the ground line 37 and terminal 33 or 32. The voltage doubler and rectifier means provides a direct electrical connection by way of line 37 netween one of the 120 volt AC power input lines and the inverter 24, as shown in FIG. 2. The bridge rectifier and the voltage doubler and rectifier provide substantially the same DC output voltage to the inverter 24 whether the AC input is 120 or 240 volts. Typical voltages are +160 volts on the B+ line 38 and –160 volts on the B– line 39.

With additional reference to FIG. 4, which shows an alternate power supply 23', the AC input, whether 120 or 240 volts, is provided at terminals 32' and 39. Terminal 39 is in turn connected through a single-pole double-throw selector switch 41 to terminal 37' (for 120 volt operation) or terminal 33' (for 240 volt operation). In all other respects, power supplies 23 and 23' are identical.

The inverter circuit 24 of FIG. 2 is a half-bridge inverter comprising transistors 42, 43 connected in series across the DC voltage output of the power supply 23 on B+ and B– lines 38 and 39, respectively. The collector of trasistor 42 is connected to the B+ line 38, the emitter of transistor 42 and the collector of transistor 43 are connected to a midpoint line 44 (designated "M") and the emitter of transistor 43 is connected to the B– line 39. The midpoint line 44 is in turn connected to the ground line 37 through primary winding 46 of a toroidal saturable core transformer 47, a primary winding 48 on an identical transformer 49, an inductor 51 and a series-connected capacitor 52. The inductor 51 and capacitor 52 are energized upon alternate transistor conduction in a manner to be described later.

An external load 26 is preferably taken off capacitor 52, as shown in FIG. 2. The inductor 51, preferably a known ferrite core inductor, has an inductance variable by mechanical adjustment of the air gap in order to effect variation in the level of the inductor and capacitor voltage and hence the power available to the load, as will be described. When the load is a gas discharge lamp such as lamp 11 in FIG. 1, variation in this inductance upon rotation of knob 22 accomplishes a lamp dimming effect.

Drive current to the base terminals of transistors 42 and 43 is provided by secondary windings 53, 54 of transformers 49, 47, respectively. Winding 53 is also connected to midpoint lead 44 through a bias capacitor 56, while winding 54 is connected to the B– lead 39 through an identical bias capacitor 57. The base terminals of transistors 42 and 43 are also connected to lines 38 and 44 through bias resistors 58 and 59, respectively. For a purpose to be described later, the base of transistor 42 can be optionally connected to a diode 61 and a series Zener diode 64 in turn connected to the midpoint line 44; similarly, a diode 63 and series Zener diode 64 in turn connected to the B– line 39 can be connected to the base of transistor 43. Shunt diodes 66 and 67 are connected across the collector-emitter terminals of transistors 42 and 43, respectively. Finally, a capacitor 68 is connected across the collector-emitter terminals of transistor 43 to restrain the rate of voltage rise across those terminals, as will be seen presently.

The operation of the circuit of FIG. 2 can best be understood with additional reference to FIG. 3, which illustrates significant portions of the waveforms of the voltage at midpoint M (FIG. 3A), the base-emitter voltage on transistor 42 (FIG. 3B), the current through transistor 42 (FIG. 3C), and the capacitor 52 voltage and the inductor 51 current (FIG. 3D).

Assuming that transistor 42 is first to be triggered into conduction, current flows from the B+ line 38 through windings 46 and 38 and the inductor 51 to charge capacitor 52 and returns through capacitor 34 (refer to the time period designated I in FIG. 3). When the saturable inductor 49 saturates at the end of period I, drive current to the base of transistor 42 will terminate, causing voltage on the base of the transistor to drop to the negative voltage stored on the bias capacitor 56 in a manner to be described, causing this transistor to become non-conductive. As shown in FIG. 3c, current-flow in transistor 43 terminates at the end of period I.

Because the current through inductor 51 cannot change instantaneously, current will flow from the B− bus 39 through capacitor 68, causing the voltage at midpoint line 44 to drop to −160 volts (period II in FIG. 3). The capacitor 68 restrains the rate of voltage change across the collector and emitter terminals of transistor 42. The current through the inductor 51 reaches its maximum value when the voltage at the midpoint line 44 is zero. During period III, the current will continue to flow through inductor 51 but will be supplied from the B− bus through the shunt diode 67. It will be appreciated that during the latter half of period II and all of period III, positive current is being drawn from a negative voltage; which, in reality, means that energy is being returned to the power supply through a path of relatively low impedance.

When the inductor current reaches zero at the start of period IV, the current through the primary winding 46 of the saturable inductor 47 will cause a current to flow out of its secondary winding 54 to cause transistor 43 to become conductive, thereby causing a reversal in the direction of current through inductor 51 and capacitor 52. When transformer 47 saturates at the end of period IV, the drive current to the base of transistor 43 terminates and the current through inductor 51 will be supplied through capacitor 68, causing the voltage at midpoint line 44 to rise (period V). When the voltage at the midpoint line M reaches 160 volts, the current will then flow through shunt diode 66 (period VI). The cycle is then repeated.

As seen in FIG. 3, saturable transformers 47, 49 provide transistor drive current only after the current through inductor 51 has diminished to zero. Further, the transistor drive current is terminated before the current through inductor 51 has reached its maximum amplitude. This coordination of base drive current and inductor current is achieved because of the series-connection between the inductor 51 and the primary windings 46, 48 of saturable transformers 47, 49, respectively.

The series-connected combination of the inductor 51 and the capacitor 52 is energized upon the alternate conduction of transistors 42 and 43. With a large value of capacitance of capacitor 52, very little voltage will be developed across its terminals. As the value of this capacitance is decreased, however, the voltage across this capacitor will increase. As the value of the capacitor 52 is reduced to achieve resonance with the inductor 51, the voltage on the capacitor will rise and become infinite in a loss-free circuit operating under ideal conditions.

It has been found desirable to regulate the transistor inversion frequency, determined mainly by the saturation time of the saturable inductors 47, 49, to be equel to or higher than the natural resonance frequency of the inductor and capacitor combination in order to provide a high voltage output to external load 26. A high voltage across capacitor 52 is efficiently developed as the transistor inversion frequency approaches the natural resonant frequency of the inductor 51 and capacitor 52 combination. Stated another way, the conduction period of each transistor is desirably shorter in duration than one quarter of the full period corresponding to the natural resonant frequency of the inductor and capacitor combination. When the inverter 24 is used with a self-ballasted gas discharge lamp unit, it has been found that the inversion frequency can be at least equal to the natural resonant frequency of the tank circuit. If the capacitance value of capacitor 52 is reduced still further beyond the resonance point, unacceptably high transistor currents will be experienced during transistor switching and transistor burn-out will occur.

It will be appreciated that the sizing of capacitor 52 is determined by the application of the inverter circuit 24. Variation in the values of the capacitor 52 and the inductor 51 will determine the voltages developed in the inductor-capacitor tank circuit. The external load 26 may be connected in circuit with the inductor 51 (by a winding on the inductor, for example) and the capacitor may be omitted entirely. If the combined circuit loading of the inductor 51 and the external load 26 has an effective inductance of value sufficient to effect periodic energy storage for self-sustained transistor inversion, the current feedback provided by the saturable inductors 47, 49 will effect alternate transistor conduction without the need for additional voltage feedback. When the capacitor 52 is omitted, the power supply 23 provides a direct electrical connection between one of the AC power input lines and the inverter load circuit.

Because the voltages across transistors 42, 43 are relatively low (due to the effect of capacitors 34, 36), the half-bridge inverter 24 is very reliable. The absence of switching transients minimizes the possibility of transistor burn-out.

The inverter circuit 24 comprises means for supplying reverse bias to the conducting transistor upon saturation of its associated saturable inductor. For this purpose, the capacitors 56 and 57 are charged to negative voltages as a result of reset current flowing into secondary windings 53, 54 from the bases of transistors 42, 43, respectively. This reverse current rapidly turns off a conducting transistor to increase its switching speed and to achieve inverter circuit efficiency in a manner described more fully in my co-pending U.S. patent application Ser. No. 103,624 filed Dec. 14, 1979 and entitled "Bias Control for High Efficiency Inverter Circuit" (now U.S. Pat. No. 4,307,353). The more negative the voltage on the bias capacitors 56 and 57, the more rapidly charges are swept out of the bases of their associated transistors upon transistor turn-off.

When a transistor base-emitter junction is reversely biased, it exhibits the characteristics of a Zener diode having a reverse breakdown voltage on the order of 8 to 14 Volt for transistors typically used in high-voltage inverters. As an alternative, to provide a negative voltage smaller in magnitude on the base lead of typical transistor 42 during reset operation, the optional diode 61 and Zener diode 62 combination can be used. For large values of the bias capacitor 56, the base voltage will be substantially constant.

If the load 26 comprises a gas discharge lamp, the voltage across the capacitor 52 will be reduced once the lamp is ignited to prevent voltages on the inductor 51 and the capacitor 52 from reaching destructive levels. Such a lamp provides an initial time delay during which a high voltage, suitable for instant starting, is available.

FIG. 5 illustrates the use of an alternate load 26' adapted for plug-in connection to an inverter circuit such as shown in FIG. 2. The load 26' consists of a gas discharge lamp 71 having electrodes 72, 73 and connected in series with a capacitor 74. The combination of lamp 71 and capacitor 74 is connected in parallel with a capacitor 52' which serves the same purpose as capacitor 52 in the FIG. 2 circuit. However, when the load 26' is unplugged from the circuit, the inverter stops oscillating and the development of high voltages in the inverter is prevented. The fact that no high voltages are generated by the circuit if the lamp is disconnected while the circuit is oscillating is important for safety reasons.

FIG. 6 illustrates a capacitor 52" connected in series with an inductor 51" through a heater 81 suitable for heating the toroidal inductors 47, 49 in accordance with the level of output. The load 26" is connected across the series combination of the capacitor 52" and the toroid heater. The heater 81 is preferably designed to controllably heat the toroidal saturable inductors in order to decrease their saturation flux limit and hence their saturation time. The result is to decrease the periodic transistor conduction time and thereby increase the transistor inversion frequency. When a frequency-dependent impedance means, that is, an inductor or a capacitor, is connected in circuit with the AC voltage output of the inverter, change in the transistor inversion frequency will modify the impedance of the frequency-dependent impdance means and correspondingly modify the inverter output. Thus as the level of the output increases, the toroid heater 81 is correspondingly energized to effect feedback regulation of the output. Further, transistors 42, 43 of the type used in high voltage inverters dissipate heat during periodic transistor conduction. As an alternative, the toroid heater 81 can use this heat for feedback regulation of the output or control of the temperature of transistors 42, 43.

The frequency dependent impedance means may also be used in a circuit to energize a gas discharge lamp at adjustable illumination levels. Adjustment in the inversion frequency of transistors 42, 43 results in control of the magnitude of the AC current supplied to the lamp. This is preferably accomplished where saturable inductors 47, 49 have adjustable flux densities for control of their saturation time.

FIG. 7 schematically illustrates an alternate form of inverter circuit, shown without the AC to DC power supply connections for simplification. In this Figure, the transistors are connected in parallel rather than in series but the operation is essentially the same as previously described.

In particular, this circuit comprises a pair of alternately conducting transistors 91, 92. The emitter terminals of the transistors are connected to a B− line 93. A B+ lead 94 is connected to the center-tap of a transformer 96. In order to provide drive current to the transistors 91, 92 for control of their conduction frequency, saturable inductors 97, 98 have secondary windings 99, 101, respectively, each secondary winding having one end connected to the base of its associated transistor; the other ends are connected to a common terminal 102. One end of transformer 96 is connected to the collector of transistor 91 through a winding 103 on inductor 98 in turn connected in series with a winding 104 on inductor 97. Likewise, the other end of transformer 96 is connected to the collector of transistor 92 through a winding 106 on inductor 97 in series with another winding 107 on inductor 98.

The B+ terminal is connected to terminal 102 through a bias resistor 108. A bias capacitor 109 connects terminal 102 to the B− lead 93. This resistor and capacitor serve the same function as resistors 58, 59 and capacitors 56, 57 in the FIG. 2 circuit.

The bases of transistors 91, 92 are connected by diodes 111, 112, respectively, to a common Zener diode 113 in turn connected to the B− lead 93. The common Zener diode 113 serves the same function as individual Zener diodes 62, 64 in FIG. 2.

Shunt diodes 114, 116 are connected across the collector-emitter terminals of transistors 91, 92, respectively. A capacitor 117 connecting the collectors of transistors 91, 92 restrains the rate of voltage rise on the collectors in a manner similar to the collector-emitter capacitor 68 in FIG. 2.

Inductive-capacitive loading of the FIG. 7 inverter is accomplished by a capacitor 118 connected in series with with an inductor 119, the combination being connected across the collectors of the transistors 91, 92. A load 121 is connected across the capacitor 118.

FIG. 8 illustrates how an inverter loaded with a series capacitor 122 and inductor 123 can be used to energize a "rapid-start" fluorescent lamp 124 (the details of the inverter circuit being omitted for simplication). The lamp 124 has a pair of cathodes 126, 127 connected across the capacitor 122 for supply of operating voltage in a manner identical to that previously described. In addition, the inductor 123 comprises a pair of magnetically-coupled auxiliary windings 128, 129 for electrically heating the cathodes 126, 127, respectively. A small capacitor 131 is connected in series with lamp 124.

Additional Explanations and Comments re Initial Embodiments (a) With reference to FIGS. 2 and 5, adjustment of the amount of power supplied to load 26', and thereby the amount of light provided by lamp 71, may be accomplished by applying a voltage of adjustable magnitude to input terminals IP1 and IP2 of the Toroid Heater; which is thermally coupled with the toroidal ferrite cores of saturable transformers 47, 49.

(b) With commonly available components, inverter circuit 24 of FIG. 2 can be made to operate efficiently at any frequency between a few kHz to perhaps as high as 50 kHz. However, for various well-known reasons (i.e., eliminating audible noise, minimizing physical size, and maximizing efficiency), the frequency actually chosen is in the range of 20 to 40 kHz.

(c) The fluorescent lighting unit of FIG. 1 could be made in such manner as to permit fluorescent lamp 11 to be disconnectable from its base 12 and ballasting means 16. However, if powered with normal line voltage without its lamp load connected, frequency-converting power supply and ballasting circuit 16 is apt to self-destruct.

To avoid such self-destruction, arrangements can readily be made whereby the very act of removing the load automatically establishes a situation that prevents the possible destruction of the power supply and ballasting means. For instance, with the tank capacitor (52) being permanently connected with the lamp load (11)—thereby automatically being removed whenever the lamp is removed—the inverter circuit is protected from self-destruction.

(d) At frequencies above a few kHz, the load represented by a fluorescent lamp—once it is ignited—is substantially resistive. Thus, with the voltage across lamp 11 being of a substantially sinusoidal waveform (as indicated in FIG. 3d), the current through the lamp will also be substantially sinusoidal in waveshape.

(e) In the fluorescent lamp unit of FIG. 1, fluorescent lamp 11 is connected with power supply and ballasting circuit 16 in the exact same manner as is load 26 connected with the circuit of FIG. 2. That is, it is connected in parallel with the tank capacitor (52) of the L-C series-resonant circuit. As is conventional in instant-start fluorescent lamps—such as lamp 11 of FIG. 1—the two terminals from each cathode are shorted together, thereby to constitute a situation where each cathode effectively is represented by only a single terminal. However, it is not necessary that the two terminals from each cathode be shorted together; in which case—for instant-start operation—connection from a lamp's power supply and ballasting means need only be made with one of the terminals of each cathode.

(f) With respect to the circuit arrangement of FIG. 9, in situations where the tank inductor 123 includes a ferrite magnetic core having an air gap, one particularly cost-effective way of accomplishing the indicated loose coupling between the tank inductor 123 and the auxiliary windings 128, 129 is that of arranging for the auxiliary windings to be placed in the air gap in such a manner that they each couple only with part of the magnetic flux crossing the air gap.

DESCRIPTION OF PRESENTLY PREFERRED EMBODIMENT OF INVENTION

Details of Construction

FIG. 9 represents mainly a side-view of the invention in its presently preferred embodiment.

In FIG. 9, a fluorescent lamp FL as well as an incandescent lamp IL are each mounted on a power supply housing PSH, within which—shown in phantom outline—is a power supply PS. The integral combination of fluorescent lamp FL, incandescent lamp IL, power supply housing PSH and power supply PS is mounted on a screw-base SB.

Fluorescent lamp FL includes thermionic cathodes TC1 and TC2, each of which is connected by way of a pair of conductors with power supply PS.

Incandescent lamp IL includes an incandescing filament IF, which is connected with power supply PS by way of a pair of conductors IFc.

Screw-base SB has a first base terminal BT1 and a second base terminal BT2, each one of which is connected with power supply PS via a pair of power input terminals PIT.

Figure 10:
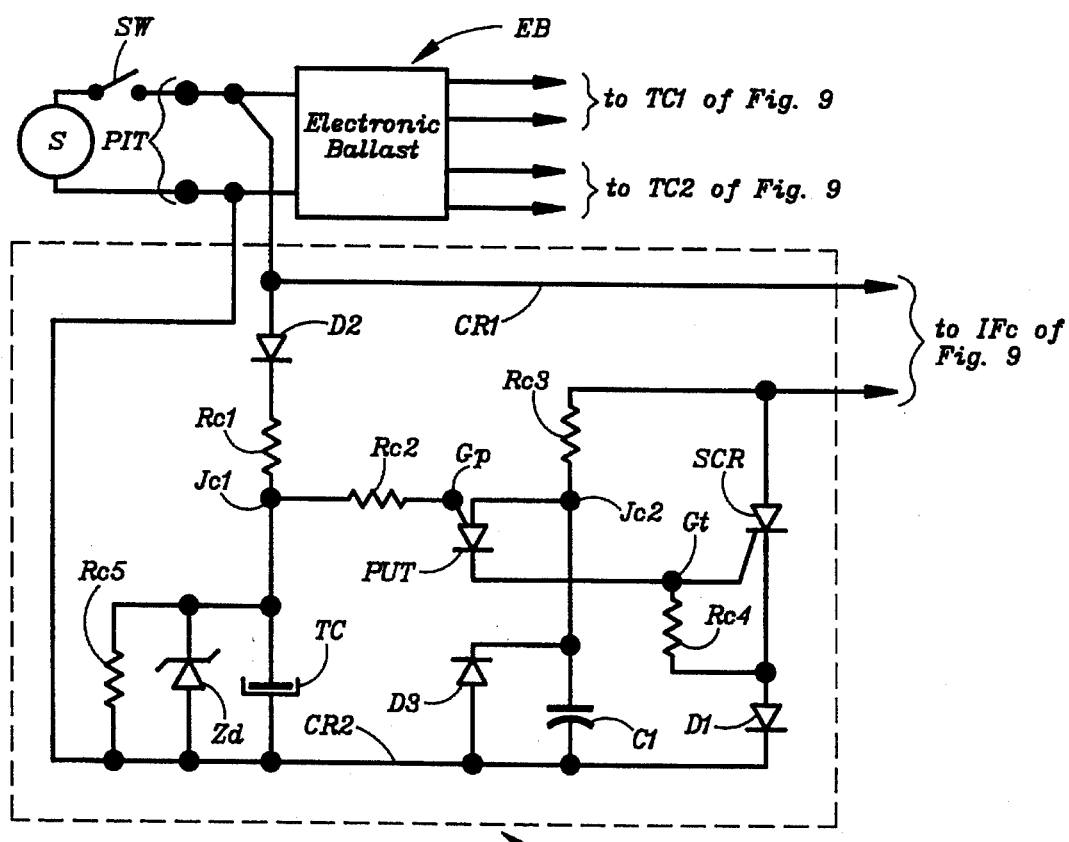
FIG. 10 schematically illustrates the power supply used in the preferred embodiment of the invention.

FIG. 10 is a schematic circuit diagram of power supply PS as it is connected with a source of AC power line voltage S by way of a switch SW.

Otherwise in FIG. 10, an electronic ballast EB has a single pair of input terminals connected with power input terminals PIT and has two pairs of output terminals—with the one pair being connected with cathode terminals TC1 of fluorescent lamp FL of FIG. 9, and with the other pair being connected with cathode terminals TC2 of fluorescent lamp FL of FIG. 9.

One of power input terminals PIT is connected with one of terminals IFc of incandescent lamp IL. The other one of terminals IFc is connected with the anode of a thyristor SCR, whose cathode is connected with the anode of a diode D1, whose cathode is connected with the other one of power input terminals PIT.

Said one of power input terminals PIT is connected with a first conductor rail CR1; while said other one of power input terminals PIT is connected with a second conductor rail CR2.

A diode D2 is connected with its anode to conductor rail CR1; its cathode being connected with a junction Jc1 by way of a resistor Rc1.

A resistor Rc2 is connected between junction Jc1 and the gate terminal Gp of a programmable unijunction transistor PUT; whose cathode is connected with the gate terminal Gt of thyristor SCR, and whose anode is connected with a junction Jc2.

a resistor Rc3 is connected between the anode of thyristor SCR and junction Jc2; while a resistor Rc4 is connected between gate terminal Gt and the cathode of thyristor SCR.

A capacitor C1 is connected between junction Jc2 and conductor rail CR2. A diode D3 is connected with its cathode to junction Jc2 and with its anode to conductor rail CR2.

A timing capacitor TC is connected between junction Jc1 and conductor rail CR2, as is also a resistor Rc5. In parallel with timing capacitor TC is connected a Zener diode ZD, whose cathode is connected with junction Jc1 and whose anode is connected with conductor rail CR2.

Details of Operation

With reference to FIGS. 9 and 10, wherein the Electronic Ballast (EB) is of the type described in connection with FIG. 2, the operation of the presenety preferred embodiment may best be understood by referring to the waveforms of FIG. 11, wherein:

Waveform (a) depicts the luminous output from fluorescent lamp FL during the first few minutes after initial closure of switch SW.

Waveform (b) depicts the luminous output from incandescent lamp IL during the first few minutes after initial closure of switch SW.

Waveform (c) depicts the luminous output of the combined structure of FIG. 9 (i.e., of the presently preferred embodiment of subject Instant-On Screw-in Fluorescent Lamp) during the first few minutes after initial closure of switch SW.

Waveforms (d) through (g) depict the luminous output of the combined structure of FIG. 9 during the first few minutes of renewed operation after the opening of switch SW for different lengths of time after it has been closed for a period long enough to have caused the combined structure to have attained stabilized operation.

Waveform (h) depicts the magnitude of the power drawn from power line source S during the first few minutes after initial closure of switch SW; which is to say: during the same period as that depicted by Waveform (c).

Waveforms (i) through (1) depict the magnitude of the power drawn from power line source S for the very same periods as those of Waveforms (d) through (g).

Waveforms (m) through (q) depict the waveform of the current drawn from power line source S at different points in time during the first two minutes after initial closure of switch SW.

As illustrated by Waveform (a), when switch SW is initially closed, fluorescent lamp FL starts emitting light in a gradually increasing manner, requiring nearly two minutes to reach its intended steady-state level of luminous output. While this slowly increasing luminous output does not occur with ordinary fluorescent lamps, in which the lamp gas pressure is very low, it does occur with fluorescent lamps in which the lamp gas pressure is made somewhat higher than usual (although still far lower than the relatively high gas pressure associated with so-called high-pressure gas discharge lamps).

{The reason for providing fluorescent lamps with somewhat higher-than-usual lamp gas pressure relates to a desire to attain higher lumen output per unit surface area of the fluorescent lamp, thereby getting more light output from a lamp of a given physical size.}

Due to action of the Power Control Circuit, the luminous output from incandescent lamp IL is high initially, but then decreases gradually and in such manner as to reach zero after about two minutes. This gradual decay in luminous output from the incandescent lamp results from the time-constant associated with resistor Rc1 and timing capacitor TC. As the magnitude of the DC voltage on timing capacitor TC increases, it takes a correspondingly higher-magnitude voltage on capacitor C1 to cause the PUT to fire (i.e., trigger or avalanche), thereby to cause the SCR to be triggered into its conductive state. Eventually, after the magnitude of the DC voltage on capacitor TC has actually reached the Zener voltage of Zener diode ZD, during each cycle of the AC power line voltage, the DC voltage on capacitor C1 fails to reach a magnitude high enough to cause the PUT to fire. Thus, after the magnitude of the DC voltage on capacitor TC has reached the Zener voltage, the SCR ceases to be triggered, thereby correspondingly causing a cessation of the current flowing through the incandescent lamp.

After opening switch SW, the charge on timing capacitor TC slowly dissipates by way of resistor Rc4, reaching zero after about 20 minutes. Thus, if switched OFF after having become stabilized, and if thereafter switched ON again after some given period of off-time, the degree of action provided by the incandescent lamp will depend entirely upon the duration of this given period of off-time: varying from no action at all if switched ON within an off-time of about three minutes, to full action if switched back ON after more than about 20 minutes of off-time.

Additional Comments re Preferred Embodiment (aa) With dimensional proportions approximately as shown in FIG. 9, the amount of light attainable from a triple-folded fluorescent lamp {such as used in the so-called Earth Light Model SLS 23 from Philips Lighting Company, Somerset, N.J. 08875} is about 1550 Lumens and the amount of power drawn from a 120 Volt/60 Hz power line is about 23 Watt. For an incandescent lamp to provide sufficient light to yield the compensation shown by Waveform (c) in FIG. 11, it needs to provide a maximum lumen output of nearly 1550 Lumens.

Usually, for a light bulb designed to operate on ordinary 120 Volt AC power line voltage to provide 1550 Lumens of light output, it needs to be of a physical size many times larger than the incandescent lamp (IL) shown in FIG. 9. However, since incandescent lamp IL is only used for a brief period (e.g., two minutes) each time the Instant-On Screw-in Fluorescent Lamp of FIG. 9 is switched ON and used for a typical period of four hours, it can be made far smaller than otherwise would be feasible. Thus, the incandescent lamp (IL) of FIG. 9 is preferably made with ordinary soft glass; which is the kind of inexpensive glass used with ordinary household light bulbs.

Moreover, since the fluorescent lamp (FL) will have a useful life of about 10,000 hours when used for four hours per start, the effective service life of the incandescent lamp (IL) need only be about 100 hours; during most of which time it yields only a fraction of its maximum luminous output. Thus, when measured at its maximum light output level, the service life of the incandescent lamp (IL) need only be about 10 hours; which means that its color temperature will be particularly appropos in comparison with the color temperature normally associated with fluorescent lamps.

(ab) Since incandescent lamp IL is powered from the 120 Volt AC power line voltage by way of an SCR, the maximum RMS magnitude that can possibly be applied across the lamp's terminals is about 84 Volt; which is 120 Volt divided by the square root of two. In reality, however, the maximum applied RMS voltage is somewhat below 84 Volt; and incandescent lamp IL is designed to provide its maximum required luminous output at a voltage of about 75 Volt RMS, at which point it draws about 55 Watt from the power line.

(ac) In effect, incandescent lamp IL is surrounded on two sides by the legs (i.e., straight cylindrical sections) of fluorescent lamp FL; which fluorescent lamp is preferably multi-folded and has four or six legs. Thus, much of the light emitted from incandescent lamp IL transmits through the phosphorous coatings within fluorescent lamp FL, thereby appearing as if coming from the fluorescent lamp.

(ad) One key characteristic of a so-called high intensity gas discharge lamp is the difficulty of restriking the lamp arc once it has been extinguished after the lamp has reached its steady-state operating point. With fluorescent lamps, including the fluorescent lamp of FIG. 9, this is not a problem.

(ae) Another key characteristic of a high intensity gas discharge lamp is that—due to its high gas operating temperature—its gas discharge arc must be contained within an envelope of hard glass (e.g., quartz), as contrasted with the soft glass used in ordinary household light bulbs as well as in ordinary fluorescent lamps, including the fluorescent lamp of FIG. 9. Moreover, for safety reasons, the hard-glass envelope containing the gas of a high intensity gas discharge lamp must be contained within an outer (soft-glass) envelope.

Preferably, fluorescent lamp FL has a lamp gas pressure (and resulting operating temperature) just so high as to permit proper operation with an envelope of soft glass. That way, a maximum amount of light can be attained from a soft-glass lamp of a given physical size, thereby permitting a fluorescent lamp to provide even more luminous output than can be provided by an incandescent lamp of the same physical size; which, of course, provides particular advantages in connection with compact screw-in high-efficacy fluorescent lamps, such as the Instant-On Screw-in Fluorescent Lamp herein disclosed.

(af) Normally, the maximum temperature on the surface of an incandescent lamp in a soft-glass envelope—that is, on the surface of ordinary household lightbulbs up to 200 Watt—is under 500 degrees Fahrenheit.

(ag) In the Instant-On Screw-in Fluorescent Lamp of FIG. 9, it is anticipated that the fluorescent lamp be replaceable after its end-of-life. However, since it is in operation for such an exceedingly small fraction of the total operating time of the fluorescent lamp, the incandescent lamp can readily be made to have sufficiently long life span that it need not be replaceable.

Thus, in its preferred embodiment, the lamp structure of FIG. 9 is made in such a way as to permit the fluorescent lamp to be replaced at its end-of-life, while the incandescent lamp is made to have a sufficiently long operating-life not to have to be replaced for the entire effective life of the whoe lamp structure.

(ah) In the lamp structure of FIG. 9, it is also anticipated that control of total luminous output be effected by way of a photo-sensor exposed to a representative part of the total luminous output but connected in circuit with the incandescent lamp and arranged to control the luminous output from the incandescent lamp in such manner as to maintain the total luminous output substantially constant.

(ai) Although not necessarily required for safety reasons, such as to protect from excessive temperature, it is nevertheless anticipated that, at least in some situations, a light-diffusing shield be used for enclosing the two lamps of the lamp structure of FIG. 9.

We claim:

1. An arrangement comprising:
   a source functional, starting at a first point in time, to provide an AC power line voltage at a pair of AC terminals;
   a fluorescent lamp having a first set of lamp terminals;
   an electronic ballasting circuit connected between the AC terminals and the first set of lamp terminals; the electronic ballasting circuit being functional, starting at the first point in time and continuing until the AC power line voltage is removed from the AC terminals, to supply to the lamp terminals an alternating current of frequency substantially higher than that of the AC power line voltage, thereby to cause the fluorescent lamp to provide a first luminous output; the first luminous output being characterized by initially being of a relatively low magnitude and subsequently being of a substantially higher magnitude;
   an incandescent lamp having a second set of lamp terminals; and
   a power control circuit connected between the AC terminals and the second set of lamp terminals; the power control circuit being functional, starting at the first point in time, to cause the incandescent lamp to provide a second luminous output; the second luminous output being characterized by initially being of a relatively high magnitude and subsequently being of a substantially lower magnitude.

2. The arrangement of claim 1 wherein the sum of the first luminous output and the second luminous output remains substantially constant.

3. The arrangement of claim 1 wherein: (i) the fluorescent lamp is folded such as to include at least two parallel legs; and (ii) the incandescent lamp is disposed between the two legs.

4. The arrangement of claim 3 wherein: (i) each leg of the fluorescent lamp has a coating of fluorescent material; and (ii) a substantial part of the second luminous output passes through said coatings.

5. The arrangement of claim 1 wherein, after a relatively short period, the second luminous output is of zero magnitude.

6. The arrangement of claim 5 wherein said relatively short period has a duration no longer than about five minutes.

7. The arrangement of claim 1 wherein the fluorescent lamp is defined as not being a high intensity gas discharge lamp; a high intensity gas discharge lamp being a gas discharge lamp with an envelope of hard glass, such as quartz.

8. The arrangement of claim 1 wherein the fluorescent lamp, the electronic ballasting circuit, the incandescent lamp, and the power control circuit are combined into an integral structure and mounted on a screw-base functional to be screwed into and held by an ordinary lamp socket.

9. The arrangement of claim 1 wherein the fluorescent lamp is an instant-start fluorescent lamp.

10. The arrangement of claim 1 wherein the incandescent lamp is of a physical size several times smaller than that of an ordinary screw-in incandescent lamp of the same light output capability, yet—just like said ordinary screw-in incandescent lamp—is constructed of soft glass as opposed to hard glass, such as quartz.

11. The arrangement of claim 1 wherein: (i) the fluorescent lamp is characterized by including a first cylindrical section of glass having a first longitudinal axis; and (ii) the incandescent lamp is characterized by including a second cylindrical section of glass having a second longitudinal axis; the second longitudinal axis being substantially parallel with the first longitudinal axis.

12. The arrangement of claim 1 wherein the power control circuit is characterized by including an electronically controllable semiconductor sub-circuit.

13. The arrangement of claim 12 wherein the electronically controllable semiconductor sub-circuit includes a thyristor.

14. The arrangement of claim 1 wherein the electronic ballasting circuit is characterized by including:
   (a) a rectification and filtering sub-circuit functional, wherever the AC power line voltage is indeed being provided at said AC terminals, to provide a DC voltage at a pair of DC terminals; the absolute magnitude of the DC voltage being higher than the peak absolute magnitude of the AC power line voltage; and
   (b) an inverter sub-circuit connected with the DC terminals and functional to supply power to the fluorescent lamp.

15. The arrangement of claim 1 further characterized in that, starting at the first point in time, the source supplies a gradually diminishing amount of power from its AC terminals.

16. The arrangement of claim 1 wherein: (i) starting at the first point in time, the source delivers power at a first rate; and (ii) a short time after the first point in time, the source delivers power at a second rate; the second rate being substantially lower than the first rate.

17. The arrangement of claim 16 wherein the second rate is lower than half the first rate.

18. The arrangement of claim 1 further characterized by: (i) starting at the first point in time, a power line current is being supplied from the AC terminals; (ii) the waveshape of the power line current changes gradually over a short period of time following the first point in time; and (iii) the waveshape of the power line current is substantially different after said short period of time as compared with what it was immediately after the first point in time.

19. The arrangement of claim 1 wherein: (i) a lamp voltage exists across said second set of lamp terminals; and (ii) the RMS magnitude of the lamp voltage is prevented from exceeding about 70% of the RMS magnitude of the AC power line voltage.

20. The arrangement of claim 1 wherein the incandescent lamp is designed to provide its rated light output when being supplied with a voltage of RMS voltage not higher than about 70% of the RMS magnitude of the AC power line voltage.

21. The arrangement of claim 1 wherein: (i) the fluorescent lamp is functional to provide luminous output for a first total cumulative number of hours before failure; and (ii) the incandescent lamp is designed to provide luminous output for a second total cumulative number of hours before failure; the second total cumulative number of hours being substantially shorter than the first total cumulative number of hours.

22. The arrangement of claim 1 wherein the incandescent lamp: (i) is provided with a voltage having a certain maximum RMS magnitude; and (ii) if supplied continuously with a voltage of said certain maximum RMS magnitude, has a durability not longer than about 1000 hours.

23. The arrangement of claim 1 wherein the incandescent lamp is being supplied with a unidirectional current.

24. The arrangement of claim 1 wherein the electronic ballasting circuit includes a transistor:
    (a) across which exists a periodic voltage characterized by having a waveshape consisting of four time-segments: (i) a first time-segment during which its absolute magnitude remains substantially constant at a relatively low level; (ii) a second time-segment during which its absolute magnitude increases in a gradual manner; (iii) a third time-segment during which its absolute magnitude remains substantially constant at a relatively high level; and (iv) a fourth time-segment during which its absolute magnitude decreases in a gradual manner; and
    (b) through which flows a periodic current characterized by flowing only during periods when the absolute magnitude of the periodic voltage is substantially lower than said relatively high level.

25. The arrangement of claim 1 wherein the electronic ballasting circuit is characterized by being capable of instant-starting the fluorescent lamp.

26. The arrangement of claim 1 wherein, after the fluorescent lamp has been powered for a time sufficiently long to have caused its temperature to have reached a steady-state condition, the electronic ballasting circuit is operative to instantly re-ignite the fluorescent lamp in case power supplied were to it be interrupted for a short period.

27. The arrangement of claim 26 wherein the short period is under 60 seconds.

28. The arrangement of claim 1 wherein the fluorescent lamp includes lamp gas of pressure substantially higher than what is used in presently ordinary fluorescent lamps.

29. The arrangement of claim 1 wherein: (i) the fluorescent lamp includes lamp gas comprised within a glass envelope; (ii) at a second point in time, the fluorescent lamp has reached a steady state operation; and (iii) the temperature of the glass envelope is not higher than about 500 degrees Fahrenheit during the steady state operation.

30. An arrangement comprising:
    a source operative, starting at a certain point in time, to provide an AC power line voltage at a pair of AC terminals;
    a light-producing assembly having lamp terminals; the light-producing assembly being characterized by including a fluorescent lamp; and
    a conditioning circuit having power input terminals connected with the AC terminals and power output terminals connected with the lamp terminals; the conditioning circuit including a frequency-converting inverter-type power supply and otherwise being characterized by:
    (a) during the time-interval between a first point in time and a second point in time, producing a substantially constant flux of luminous output;
    (b) at the first point in time, drawing a first current from the AC terminals; and
    (c) at the second point in time, drawing a second current from the AC terminals; the RMS magnitude of the second current being substantially lower than that of the first current.

31. The arrangement of claim 30 wherein the RMS magnitude of the first current is more than twice as high as that of the second current.

32. The arrangement of claim 30 wherein: (i) the first point in time occurs within about ten seconds after said certain point in time; and (ii) the second point in time occurs at least two minutes after said certain point in time.

33. An arrangement comprising:
    a source operative, starting at a certain point in time, to provide an AC power line voltage at a pair of AC terminals;
    a light-producing assembly having lamp terminals; and
    a conditioning circuit having power input terminals connected with the AC terminals and power output terminals connected with the lamp terminals; the conditioning circuit including a frequency-converting inverter-type-power supply and otherwise being characterized by:
    (a) during the time-interval between a first point in time and a second point in time, producing a substantially constant flux of luminous output;
    (b) at the first point in time, drawing a first periodic current from the AC terminals; the first periodic current having a first waveform; and
    (c) at the second point in time, drawing a second periodic current from the AC terminals; the second periodic current having a second waveform; the second waveform being substantially different from the first waveform.

34. The arrangement of claim 33 wherein the conditioning circuit is characterized by including a frequency-converting power supply operative: (i) to provide an output voltage of frequency substantially higher than that of the AC power line voltage, and (ii) to supply, at the second point in time, substantially all the power being drawn by the lamp terminals.

35. The arrangement of claim 33 wherein the light-producing assembly is characterized by including a fluorescent lamp as well as an incandescent lamp.

36. The arrangement of claim 33 wherein the light-producing assembly is characterized by being mounted on a base functional to be inserted into and held by a lamp socket intended to receive and hold an ordinary household light bulb.

37. The arrangement of claim 33 wherein the source is characterized by the AC terminals being disposed within a lamp socket of a kind operative to receive and hold an ordinary household light bulb.

38. An arrangement comprising:
    a source operative, starting at a first point in time, to provide an AC power line voltage at a pair of AC terminals; the source being characterized by having the AC terminals located within a lamp socket of a kind operative to receive and hold an ordinary household light bulb;
    a light-producing assembly having lamp terminals; the light-producing assembly being characterized by including: (i) a fluorescent lamp; (ii) an incandescent lamp; and (iii) a base functional to be inserted into and to be held by said lamp socket; and a conditioning circuit having power input terminals connected with the AC terminals and power output terminals connected with the lamp terminals; the conditioning circuit being characterized by including a frequency-converting inverter-type power supply.

39. The arrangement of claim 38 wherein, in the event that, at a second point in time, after the source has been providing the AC power line voltage for a period long enough to have caused the light-producing assembly to have reached a steady-state level of operation and to be emitting a certain level of luminous output, the AC power line voltage be removed from the AC terminals for a brief interval of time, thereafter to be re-applied at a third point in time, the level of luminous output will be substantially the same immediately after the third point in time as it was just prior to the second point in time.

40. An arrangement comprising:

a source functional, starting at a first point in time, to provide an AC power line voltage at a pair of AC terminals;

a fluorescent lamp having a first set of lamp terminals;

circuitry connected between the AC terminals and the first set of lamp terminals; the circuitry being operative, starting at the first point in time, to supply to the lamp terminals an alternating current of frequency several times higher than that of the AC power line voltage, thereby to cause the fluorescent lamp to provide a first luminous output; the first luminous output being initially of a relatively low magnitude and subsequently being of a relatively high magnitude;

an incandescent lamp having a second set of lamp terminals; and a circuit assembly connected between the AC terminals and the second set of lamp terminals; the circuit assembly being functional, starting at the first point in time, to cause the incandescent lamp to provide a second luminous output; the second luminous output being initially of a relatively high magnitude and subsequently of a relatively low magnitude.

41. An arrangement comprising:

a source functional, starting at a first point in time, to provide an AC power line voltage at a pair of AC terminals;

a fluorescent lamp having a first set of lamp terminals and, in response to being supplied with a lamp current of given magnitude, producing a time-varying amount of light, thereby: (i) initially, immediately after being first supplied with said given magnitude of lamp current, to produce an initial level of light output; and (ii) subsequently, after having been so supplied for a period of time, to produce a subsequent level of light output, the subsequent level being higher than the initial level by more than a factor of two;

circuitry connected between the AC terminals and the first set of lamp terminals; the circuitry being operative, starting at the first point in time, to supply to the lamp terminals an alternating current of substantially constant RMS magnitude and of frequency several times higher than that of the AC power line voltage;

an incandescent lamp having a second set of lamp terminals; and auxiliary circuitry connected between the AC terminals and the second set of lamp terminals; the auxiliary circuitry being functional, starting at the first point in time, to cause the incandescent lamp to provide a second luminous output; the second luminous output being initially of a relatively high magnitude and subsequently of a relatively low magnitude.

42. An arrangement comprising:

a screw-base functional to screw into and to be held by a lamp socket of a kind operative to receive and hold an ordinary household light bulb; the screw-base having a pair of base terminals at which is provided an AC power line voltage;

a fluorescent lamp having lamp terminals; and a frequency-converting assembly mounted on the screw-base and being (i) operative to support the fluorescent lamp, (ii) connected in circuit between the base terminals and the lamp terminals, and (iii) operative to supply full operating power to the fluorescent lamp, thereby to cause it to emit light; the frequency-converting assembly being additionally characterized by including an incandescent lamp operative, at least for a brief period after the screw-base initially having been screwed into the lamp socket, to emit more light than does the fluorescent lamp.

43. An arrangement comprising:

a screw-base functional to screw into and to be held by a lamp socket of a type operative to receive and hold an ordinary household light bulb; the screw-base having a pair of base terminals at which is provided an AC power line voltage;

a fluorescent lamp having lamp terminals; and an assembly mounted on the screw-base and being (i) operative to support the fluorescent lamp, (ii) connected in circuit between the base terminals and the lamp terminals, and (iii) operative to supply alternating current to the fluorescent lamp, thereby to cause it to emit light; the alternating current being of frequency substantially higher than that of the AC power line voltage; the assembly being additionally characterized by including an incandescent lamp operative, at least during brief periods, to emit more light than does the fluorescent lamp.

* * * * *